United States Patent
Burr et al.

(10) Patent No.: US 7,174,528 B1
(45) Date of Patent: Feb. 6, 2007

(54) METHOD AND APPARATUS FOR OPTIMIZING BODY BIAS CONNECTIONS IN CMOS CIRCUITS USING A DEEP N-WELL GRID STRUCTURE

(75) Inventors: James B. Burr, Foster City, CA (US); William N. Schnaitter, San Ramon, CA (US)

(73) Assignee: Transmeta Corporation, Santa Clara, CA (US)

( * ) Notice: Subject to any disclaimer, the term of this patent is extended or adjusted under 35 U.S.C. 154(b) by 372 days.

(21) Appl. No.: 10/683,961

(22) Filed: Oct. 10, 2003

(51) Int. Cl.
  *G06F 17/50* (2006.01)
(52) U.S. Cl. .................. 716/12; 716/8; 716/2
(58) Field of Classification Search .......... 716/2, 716/7–8, 12–14
  See application file for complete search history.

(56) References Cited

U.S. PATENT DOCUMENTS

| 6,048,746 | A | 4/2000 | Burr | 438/17 |
|---|---|---|---|---|
| 6,087,892 | A | 7/2000 | Burr | 327/534 |
| 6,091,283 | A | 7/2000 | Murgula et al. | 327/537 |
| 6,218,708 | B1* | 4/2001 | Burr | 257/372 |
| 6,303,444 | B1 | 10/2001 | Burr | 438/289 |
| 6,489,224 | B1 | 12/2002 | Burr | 438/526 |
| 6,777,978 | B2* | 8/2004 | Hart et al. | 326/38 |
| 2004/0124475 | A1* | 7/2004 | Pelham et al. | 257/371 |
| 2004/0128631 | A1* | 7/2004 | Ditzel et al. | 716/2 |
| 2004/0178493 | A1* | 9/2004 | Correale, Jr. | 257/691 |
| 2004/0216074 | A1* | 10/2004 | Hart et al. | 716/16 |

\* cited by examiner

*Primary Examiner*—Stacy A Whitmore (57) ABSTRACT

A method and apparatus for optimizing body bias connections to NFETs and PFETs using a deep n-well grid structure. A deep n-well is formed below the surface of a CMOS substrate supporting a plurality of NFETs and PFETs having a nominal gate length of less than 0.2 microns. The deep n-well is a grid structure with a regular array of apertures providing electrical continuity between the bottom of the substrate and the NFETs. At least some of the PFETs reside in surface n-wells that are continuous with the buried n-well grid structure. The grid and n-well layout is performed on the basis of the functionality of the PFETs contained in the n-wells.

13 Claims, 13 Drawing Sheets

METHOD AND APPARATUS FOR OPTIMIZING BODY BIAS CONNECTIONS IN CMOS CIRCUITS USING A DEEP N-WELL GRID STRUCTURE

This patent application hereby incorporates by reference U.S. patent application entitled "LAYOUT PATTERNS FOR DEEP WELL REGION TO FACILITATE ROUTING BODY-BIAS VOLTAGE," filed on Oct. 10, 2003, Ser. No. 10/683,732, by Pelham et al., and assigned to the assignee of the present invention.

FIELD OF THE INVENTION

Embodiments of the present invention relate to electrical connections in complementary metal-oxide semiconductor (CMOS) circuits. In particular, embodiments of the present invention relate to body bias voltage connections in CMOS circuits.

BACKGROUND ART

As the operating voltages for CMOS transistor circuits have decreased, variations in the threshold voltages for the transistors have become more significant. Although low operating voltages offer the potential for reduced power consumption, threshold voltage variations due to process and environmental variables often prevent optimum efficiency and performance from being achieved due to increased leakage currents.

Threshold voltage variations may be compensated for by body biasing. In typical CMOS transistors, the body of the transistor is connected to a supply rail (e.g., $V_{ss}$ for NMOS, and $V_{dd}$ for PMOS). In this configuration the transistor is often treated as a three terminal device.

In static CMOS gates usually consist of "nstacks" and "pstacks", series/parallel combinations of transistors of the same type rooted at $V_{ss}$ for NMOS and $V_{dd}$ for PMOS. Only the transistors at the root of the stack have their bodies tied to their sources.

Body biasing introduces a bias potential between the bulk and the source of the transistor that allows the threshold voltage of the transistor to be adjusted electrically. The purpose of body biasing is to compensate for 1) process variations; 2) temperature variations; 3) supply voltage variations; 4) changes in frequency of operation; and 5) changing levels of switching activity.

Whereas the typical CMOS transistor is a three-terminal device, the body biased CMOS transistor is a four-terminal device, and thus requires a more complex interconnect scheme. Connections for body biasing may be made on the substrate surface using conventional metal/dielectric interconnects similar to those used for typical gate, drain, and source connections, or they may be made using buried complementary well structures.

For example, in a p-type substrate with a population of surface n-wells that contain p-channel field effect transistors (PFETs), a buried n-type layer may be formed in the substrate at a depth that allows for contact with the bottom of the n-wells, while providing sufficient clearance with respect to n-channel field effect transistors (NFETs) in the substrate.

Figure 1:
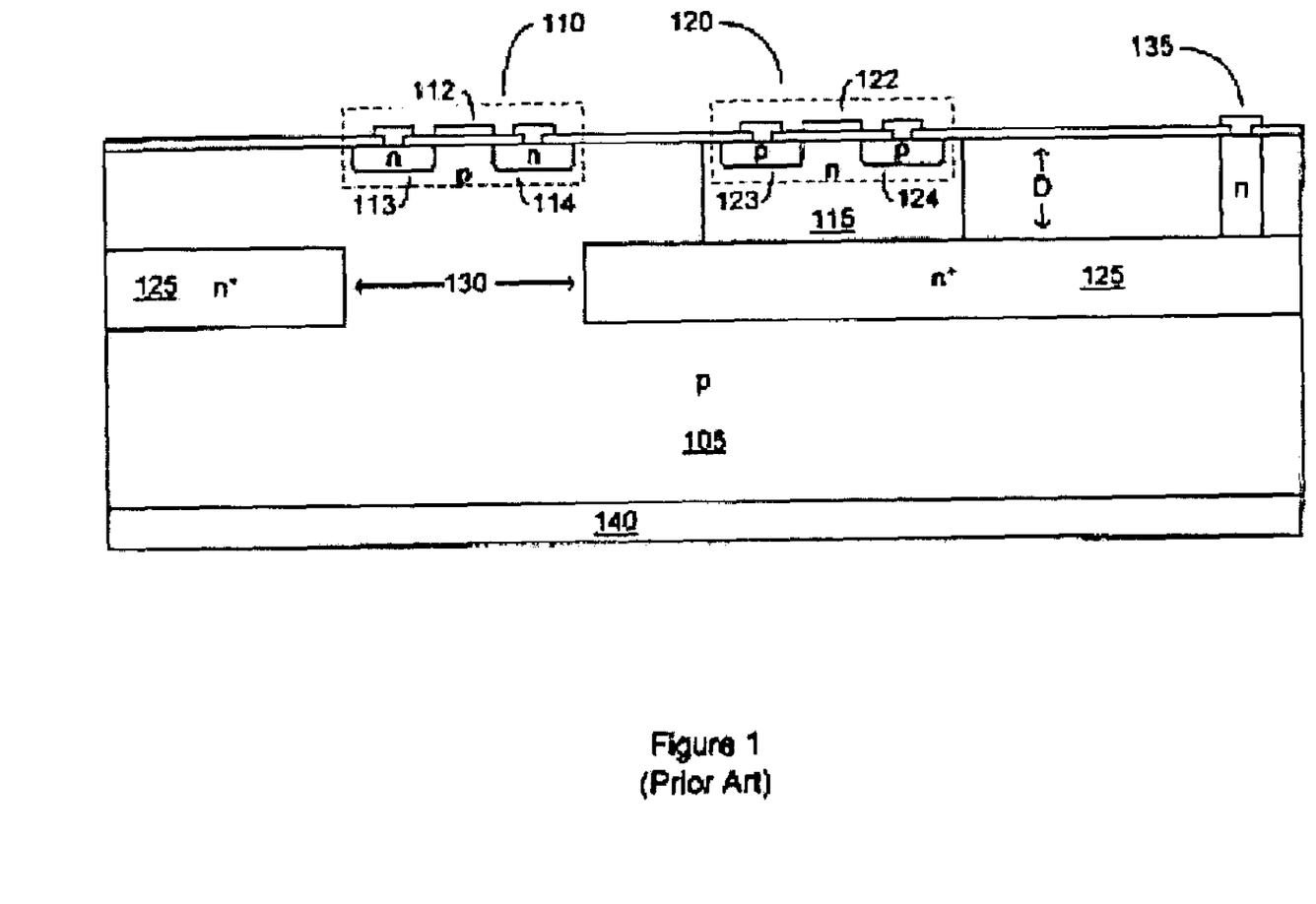
FIG. 1 shows a conventional buried n-well for body biasing of PFETs and NFETs.

Prior Art FIG. 1 shows a conventional CMOS substrate with a buried n-well. A p-type substrate 105 supports an NFET 110 and a PFET 120. The NFET 110 comprises a gate 112, source 113, and drain 114. The PFET 120 resides in an n-well 115, and comprises a gate 122, drain 123, and a source 124. Body bias is provided to the PFET 122 by a buried n-well 125 that is located a distance D below the surface of the substrate. Distance D is typically one micron or less.

A contact 135 comprising an implanted via and contact metal is typically used to establish external contact to the buried n-well. A plurality of contacts may be used to reduce the resistance in the bias path.

A body bias contact 140 is provided on the bottom of the substrate 105 for body biasing NFET 110. An aperture 130 is provided in the buried n-well 125 so that the bias potential reaches the NFET 110. It is preferable that a body biased NFET be located near an aperture 130 so that the bias path resistance is optimized.

In a retrofit application of deep n-well (DNW), if an n-well can not be reached, the nonoptimality of the leakage contributed by a few isolated PFETs will be negligible. The only constraint is that the unreachable circuits must be robust enough to operate correctly without bias when the transistor thresholds are reduced to increase performance.

Although the prior art discusses the possibility of using many buried layers in a substrate for interconnection purposes, the prior art has failed to appreciate the limitations of using deep patterned layers for interconnection to surface devices.

SUMMARY OF INVENTION

Thus, a need exists for a method that supports partial deep n-well connectivity.

Accordingly, embodiments of the present invention provide a method and apparatus for body biasing both PFETs and NFETs using a deep n-well grid structure in which n-wells containing PFETs are prioritized for connection to the deep n-well grid structure on the basis of the required functionality of the PFETs in the n-wells. In one embodiment, only a selected subset of the prioritized transistors is coupled to the n-well grid structure.

A method for optimizing body bias connections to NFETs and PFETs using a deep n-well grid structure is disclosed. A deep n-well is formed below the surface of a CMOS substrate supporting a plurality of NFETs and PFETs having a nominal gate length of less than 0.2 microns in one embodiment. The deep n-well may be a grid structure with a substantially regular array of apertures providing electrical continuity between the bottom of the substrate and the NFETs.

The PFETs reside in surface n-wells that are continuous with the buried n-well grid structure. The grid structure is located below the surface, and in one example has a critical dimension that is at least an order of magnitude greater than that of the transistors, thus preventing connection between the grid and all of the surface n-wells.

In a particular embodiment of the present invention, a deep n-well grid is formed in a substrate with an aperture area between 40% and 60%. A square aperture with a dimension of about 7 microns may be used.

In one embodiment, the grid and n-well layout is performed so as to connect the n-wells containing the highest priority PFETs on the basis of a score that can include critical path, voltage scalability requirements, power dissipation, and performance requirements. According to this priority, some of the transistors may not be connected to the body bias grid while others are.

In an alternate embodiment, in the circuit design process, the PFETs are prioritized for placement in body biased n-wells on the basis of critical path, voltage scalability requirements, power dissipation, and performance requirements. According to this priority, some of the transistors may not be connected to the body bias grid while others are.

These and other objects and advantages of the present invention will no doubt become obvious to those of ordinary skill in the art after having read the following detailed description of embodiments which are illustrated in the various drawing figures.

BRIEF DESCRIPTION OF THE DRAWINGS

Prior Art

DESCRIPTION OF THE PRESENT INVENTION

In the following detailed description of the present invention, a method for optimizing body bias connections in a CMOS circuit using a deep n-well grid structure, numerous specific details are set forth in order to provide a thorough understanding of the present invention. However, it will be obvious to one skilled in the art that the present invention may be practiced without these specific details. In other instances well known methods involving photolithography, ion implantation, deposition and etch, etc., and well known structures such as ohmic contacts and barrier metallization, etc., have not been described in detail so as not to unnecessarily obscure aspects of the present invention.

Figure 2A:
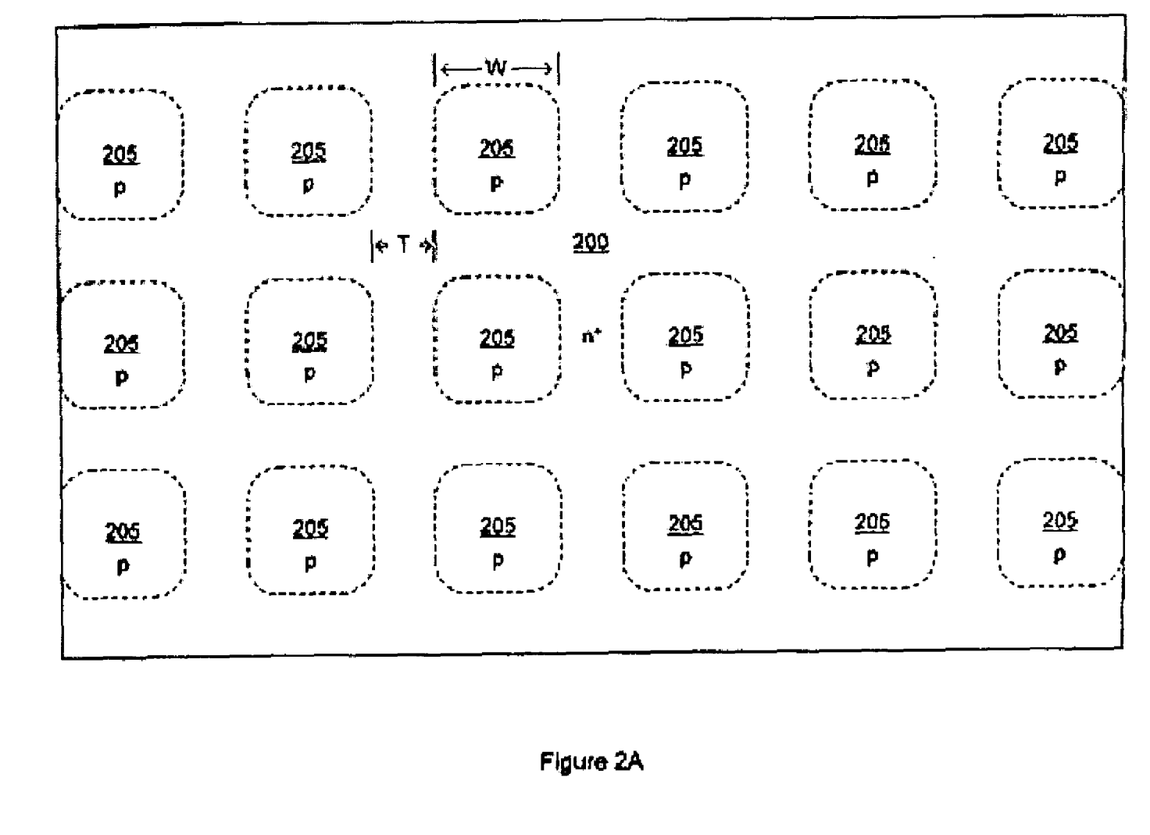
FIG. 2A shows a plan view of a deep n-well grid structure in accordance with an embodiment of the present claimed invention.

FIG. 2A shows a plan view of an exemplary deep n-well grid structure 200. For purposes of this disclosure a grid structure (or grid), is a planar sheet of semiconductor material with a regularly spaced rectangular array of apertures. Although the regular spacing of apertures in the grid structure reduces the flexibility of the grid layout, it greatly simplifies the task of producing the layout.

In view of the challenge in obtaining body biasing for all PFETs using a buried deep n-well, the overall task of circuit and deep n-well layout is optimized by using a grid that is computationally efficient, and focusing on making the best use of the PFETs that can be body biased.

In the example embodiment shown, the apertures 205 of the grid 200 are approximately square with a dimension W. The apertures are separated by a web with a dimension T. Dimensions W and T represent the minimum dimensions for the aperture and web, respectively, and are a function of the depth at which the grid 200 is formed in a substrate. The percentage of the grid area that is taken up by the apertures is preferably between 40% and 60% in one implementation, but could vary. This area distribution between the grid web and apertures provides for a balanced body biased connection for the PFETs and NFETs. The aperture may also have a shape that is rectangular, round, or oblong.

The preferred method for forming the grid is through ion implantation, with or without a subsequent thermal diffusion step. Annealing may be obtained through the thermal budget for other processing steps.

Figure 2B:
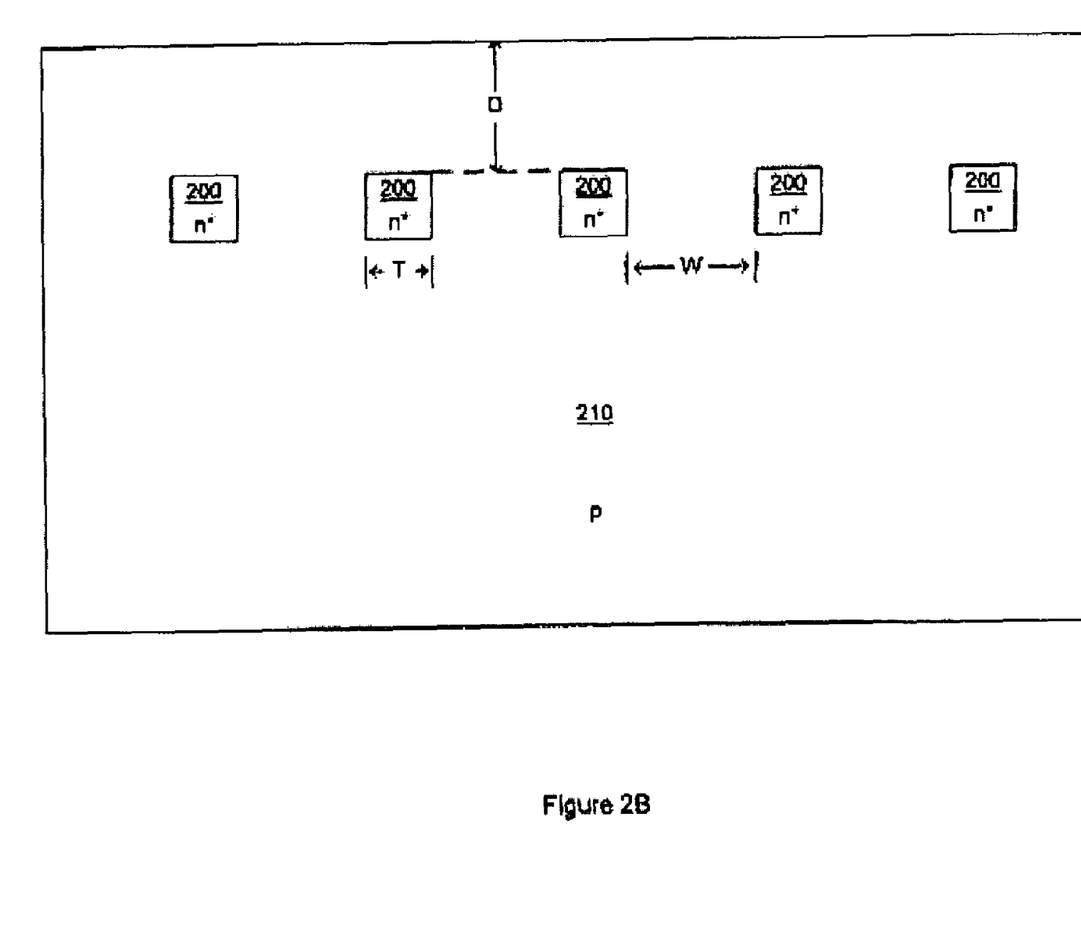
FIG. 2B shows an elevation view of a deep n-well grid structure in accordance with an embodiment of the present claimed invention.

FIG. 2B shows a cross-section elevation view of a deep n-well grid structure 200 situated in a p-type substrate 210 at a depth D. As described above, the values for W and T are functions of the depth D. This is due to the thickness of the resist that is used on the surface of the substrate 210 to define the pattern for the grid 200.

The greater the depth D at which the grid 200 is implanted, the greater the resist thickness required for pattern masking during implant. Since thin resist patterns provide finer resolution than thick resist structures, the minimum feature size W and T for the implanted grid structure increases with increasing depth D.

Within the constraints for the achievable feature size for a grid at a particular depth, the grid dimensions are preferably selected to balance the impact of the resistance of the web and the aperture. If too much of the grid area is dedicated to apertures, the reduced web of the grid will result in too much resistance in the PFET bias path. Conversely, If too little area is provided for the apertures, the bias path resistance of the NFETs will be too large.

In addition to the effects of resist thickness, scattering of the ion beam by the substrate lattice also contributes to a spreading between the aperture 205 and the grid 200. This spreading of the doping profile at the interface contributes to an increase in the critical dimensions for the web and aperture since the less abrupt p-n junction increases the depletion region width at the interface.

Figure 3A:
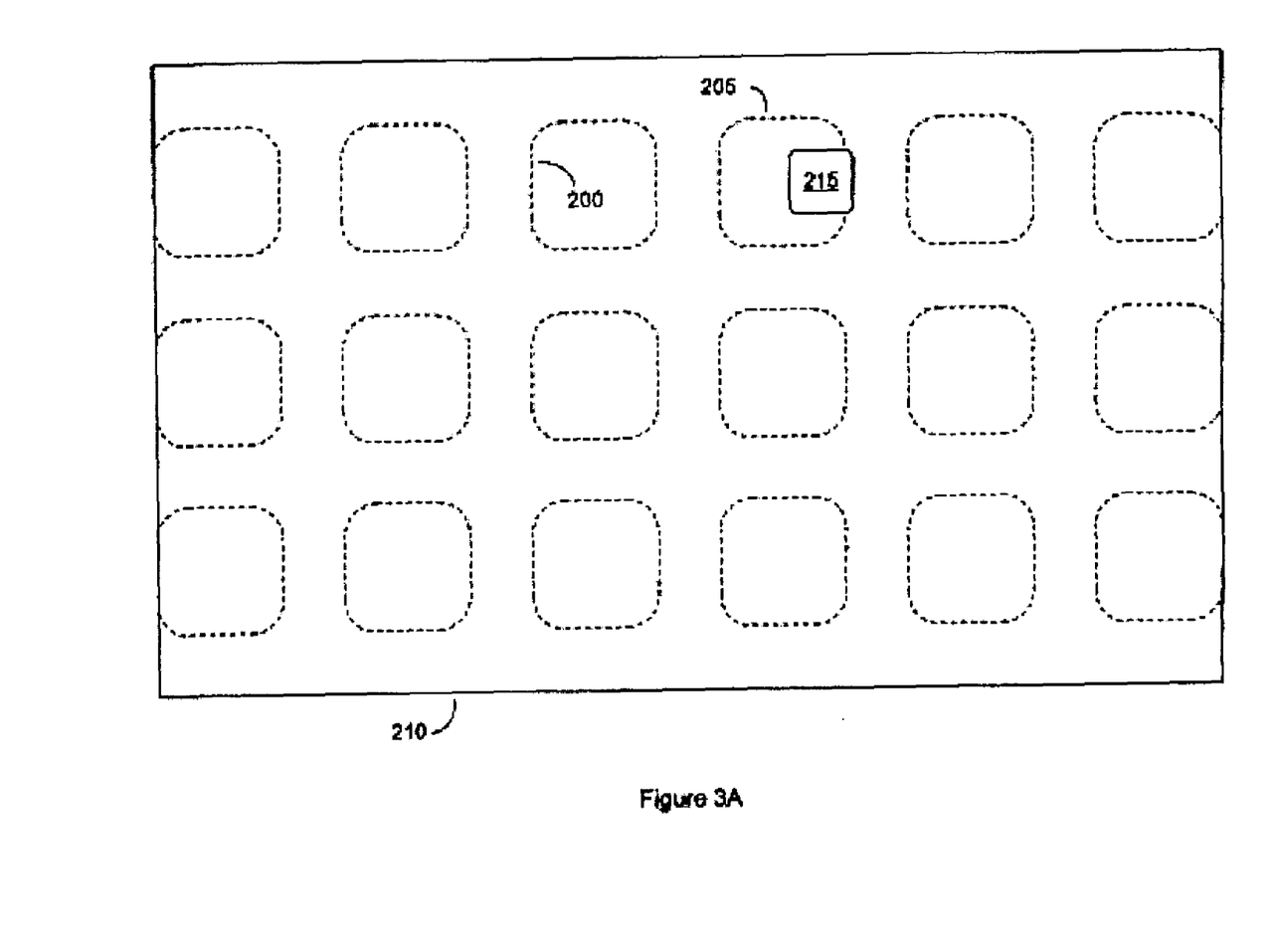
FIG. 3A shows a plan view of a deep n-well grid structure and a misregistered (e.g., inadequate overlap) surface n-well in accordance with an embodiment of the present claimed invention.

FIG. 3A shows a plan view of a substrate 210 with a deep n-well grid structure 200 and a misregistered surface n-well 215. Since the achievable feature dimension for surface n-wells is smaller than that achievable for a deep n-well, the minimum spacing between surface n-wells will be smaller than the minimum spacing between web regions, to which contact is desired. For a dense array of surface n-wells with a small pitch, it is inevitable that misregistration will occur between a portion of the surface n-wells and the grid.

Misregistration is the condition in which a surface n-well 215 achieves a partial overlap with the grid 200, but the overlap is insufficient to establish a reliable electrical connection. The overlap between the surface n-well 215 and the grid 200 should be sufficient to provide a low resistance contact under both unbiased and biased operation. Under bias, the expansion of the p-n junction depletion region should not produce a significant effect on the contact resistance.

In order to resolve the ambiguity of a misregistered n-well, the n-well may be isolated by excising or adjusting a portion of the grid, or by relocating the n-well. Relocation of the n-well may be done to establish sufficient overlap with the grid, or it may be done to isolate the n-well.

In an embodiment of the present invention it is not necessary to connect all n-wells to the DNW grid, provided three conditions are met: 1) the isolated n-wells remain connected to $V_{dd}$ as before; 2) the transistors in these wells represent a negligible fraction of the total leakage width; and 3) the circuits using these transistors are robust enough to function properly even though their thresholds are not adjustable. In a retrofit design, n-wells may be unreachable from a global DNW mesh structure, in which case their n-wells can be left connected to $V_{dd}$. N-wells may be unreachable because access is blocked by n-wells at a different potential or the target n-well is small and misregistered to the DNW mesh. If only some n-wells can be connected but not others then the connections can be prioritized.

Robustness may be an issue because one purpose of connecting n-wells with DNW is to lower the transistor thresholds to achieve higher performance. Lowering thresholds can compromise functionality unless the thresholds can be tuned or the circuits are sufficiently robust.

Alternatively, misregistered n-wells may be implanted in a separate process from body biased n-wells in order to achieve vertical isolation without relocation. Shallow isolated surface n-wells will have the greatest disparity in critical feature size with respect to the deep n-well grid structure.

Figure 3B:
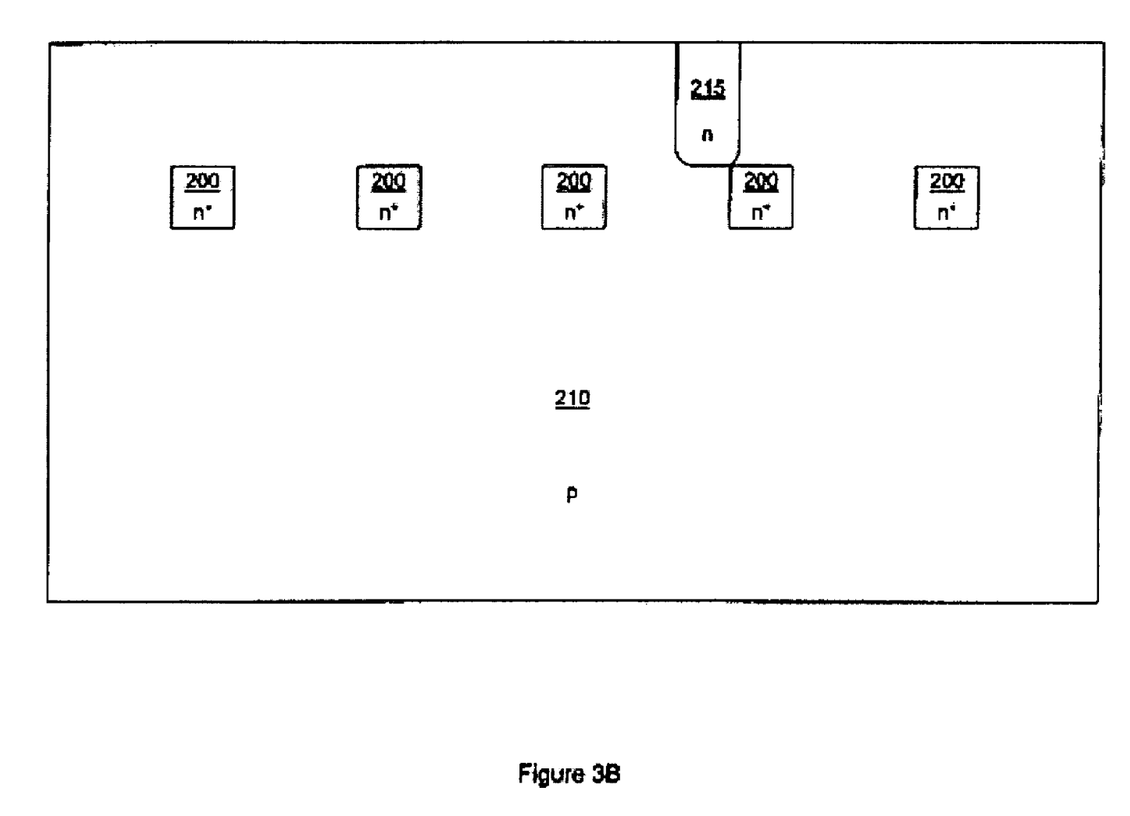
FIG. 3B shows a cross-section elevation view of the deep n-well grid structure and the misregistered surface n-well of FIG. 3A in accordance with an embodiment of the present claimed invention.

FIG. 3B shows a cross-section elevation view of substrate 210 and the deep n-well grid structure 200 with the misregistered surface n-well 215 of FIG. 3A.

Figure 4A:
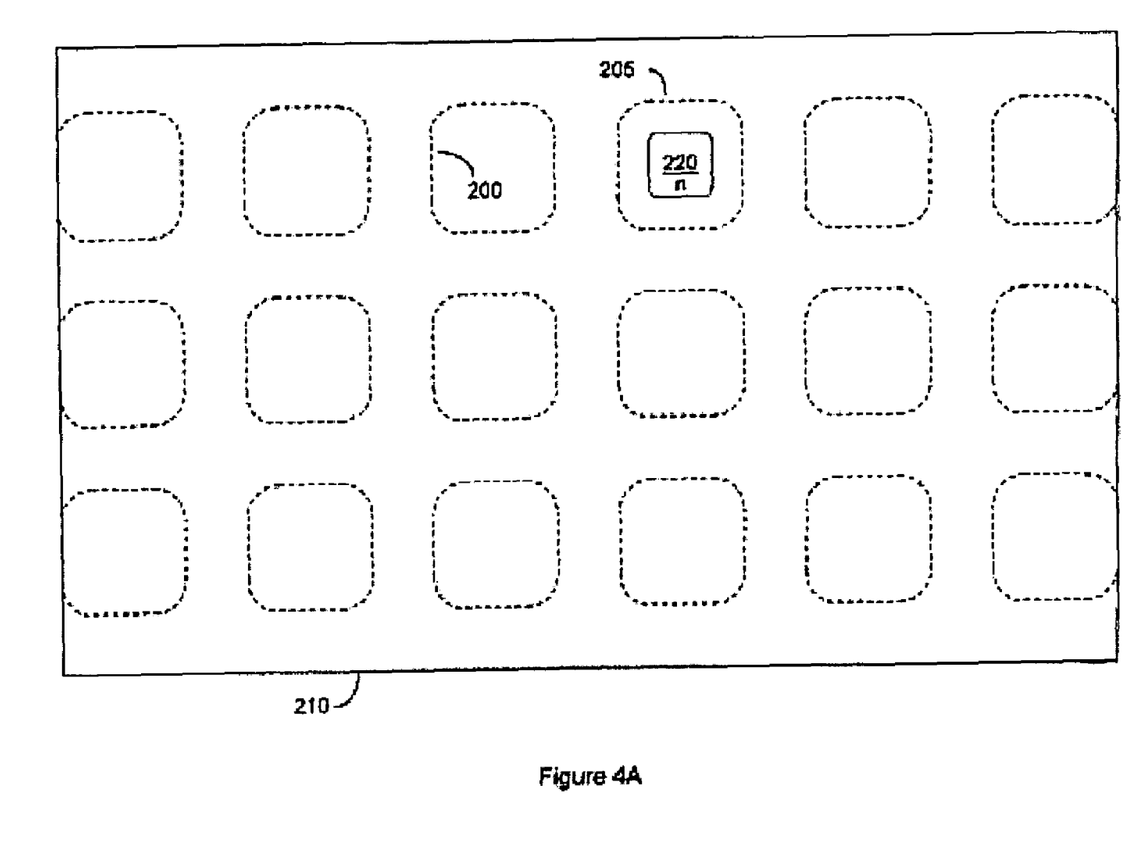
FIG. 4A shows a plan view of a deep n-well grid structure and an isolated surface n-well in accordance with an embodiment of the present claimed invention.

FIG. 4A shows a plan view of a deep n-well grid 200 structure and an isolated surface n-well 220. The n-well 220 may be isolated as a result of the initial circuit layout, or it may be isolated in order to resolve misregistration in the initial layout. Isolated n-wells are n-wells that are sufficiently separated from the grid 200, so that they are unaffected by the body bias potential applied to the grid 200.

Figure 4B:
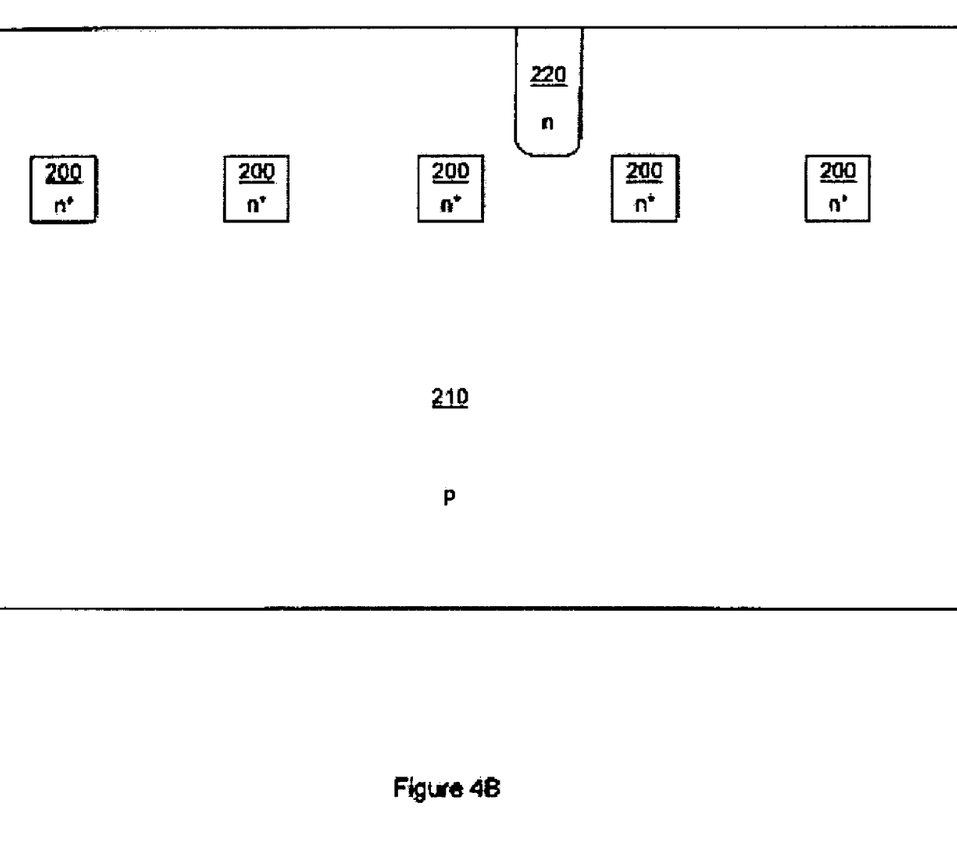
FIG. 4B shows a cross-section elevation view of the deep n-well grid structure and the isolated surface n-well of FIG. 4A in accordance with an embodiment of the present claimed invention.

FIG. 4B shows a cross-section elevation view of substrate 210 and the deep n-well grid structure 200 with the isolated surface n-well 220 of FIG. 4A. It should be noted that although a deep n-well may be provided with apertures of varying sizes and spacings in an attempt to reduce misregistration and isolation, misregistration and isolation of n-wells in a dense circuit cannot be entirely eliminated due to the disparity in the critical dimensions between surface features and the achievable features for a perforated deep n-well.

In the present invention, the inevitable isolation of a portion of the surface n-wells that results when a deep n-well is used for body biasing can be dealt with by allocating the available area for grid connection to specific types of transistors.

Figure 4C:
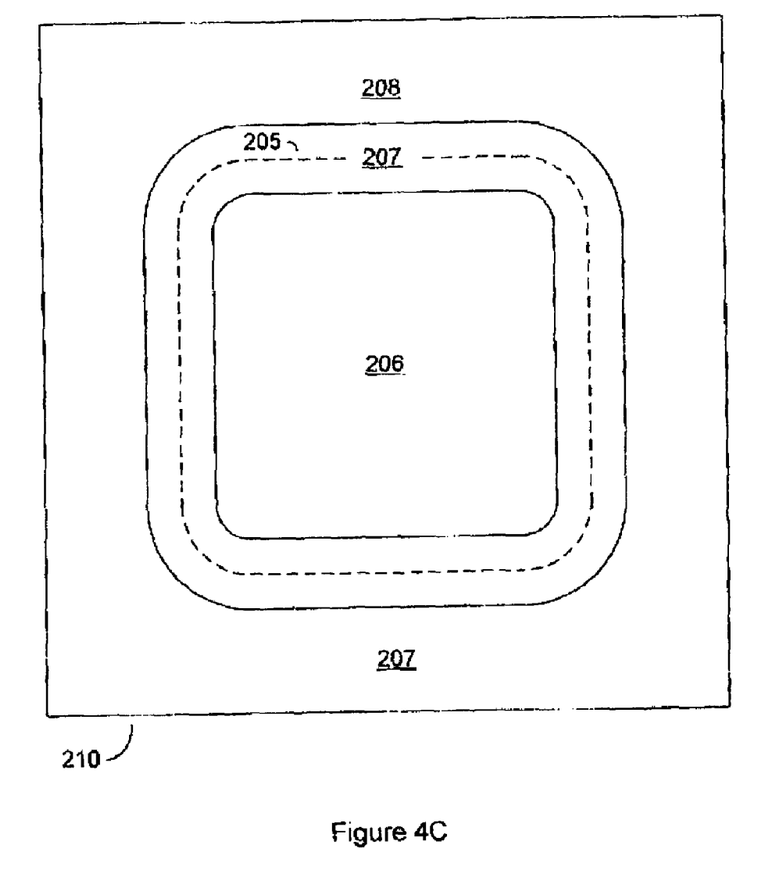
FIG. 4C shows a plan view of an aperture in the deep n-well grid structure and a buffer region separating a connection region from an isolation region, in accordance with an embodiment of the present claimed invention.

FIG. 4C shows a plan view of an aperture 205 in the deep n-well grid structure and a buffer region 207 separating a connection region 208 from an isolation region 206. The buffer region 207 ensures that an n-well will provide sufficient connection or isolation as required. The buffer region is useful for the layout of surface n-wells that have a critical dimension that is significantly smaller than the critical dimension of the grid structure.

Figure 4D:
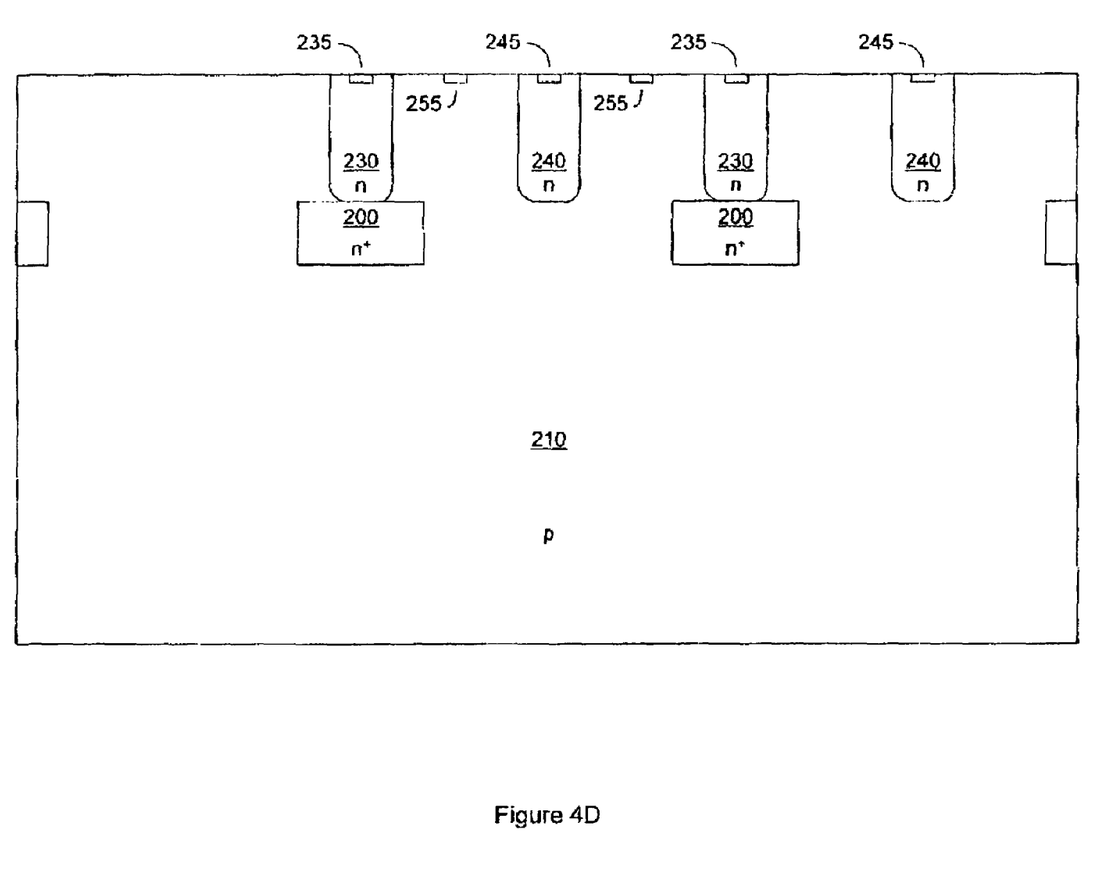
FIG. 4D shows a cross-section elevation view of connected and unconnected n-wells containing prioritized transistors in accordance with an embodiment of the present claimed invention.

FIG. 4D shows a cross-section elevation view of connected n-wells 230 and unconnected n-wells 240. The connected n-wells 230 contain transistors 235 that have a higher priority than the transistors 245 contained in the isolated n-wells 240. Body bias may be provided to transistors 235 through the grid 200. NFETs 255 may be body biased through the bulk substrate 210.

Figure 5:
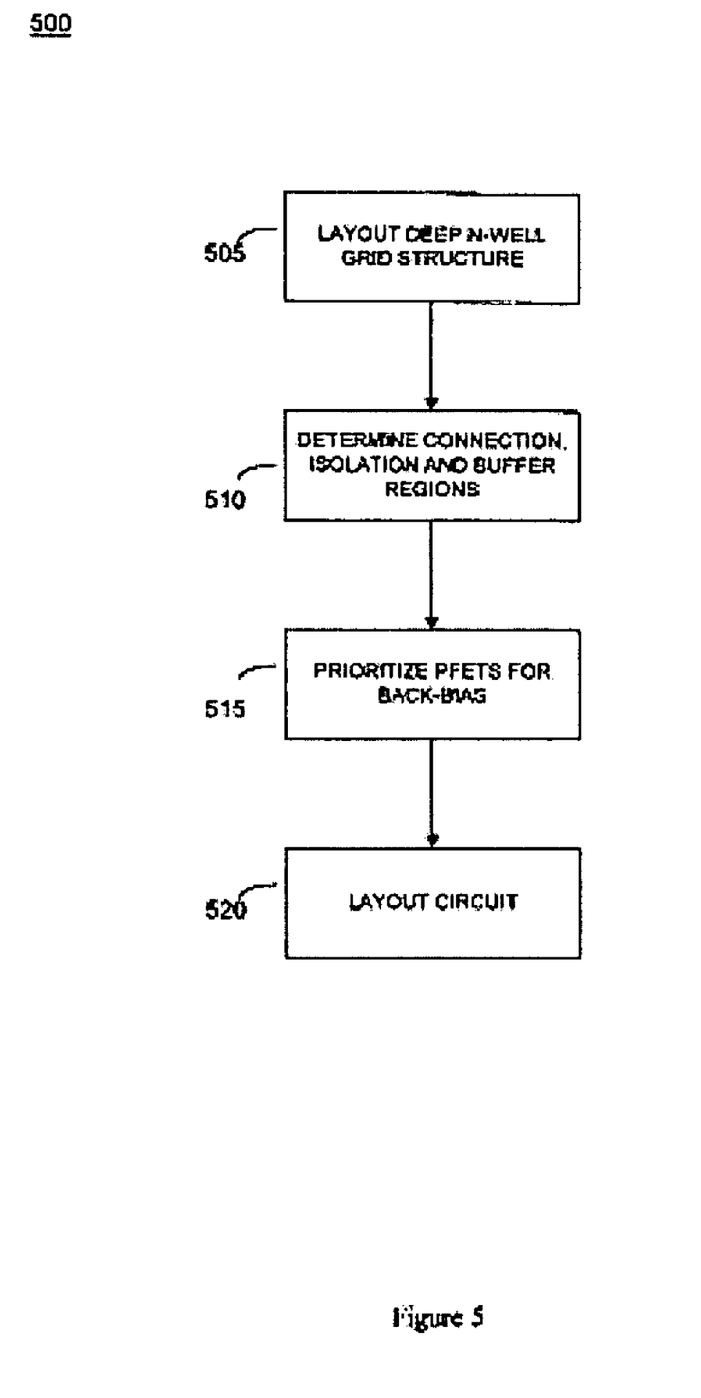
FIG. 5 shows a process flow diagram for optimizing body bias connections in a CMOS circuit using a deep n-well grid structure in accordance with an embodiment of the present claimed invention.

FIG. 5 shows a process flow diagram 500 for optimizing body bias connections in a CMOS circuit using a deep n-well grid structure in accordance with an embodiment of the present claimed invention. In the method of FIG. 5, the grid layout is determined independently from the circuit layout, and is a fixed constraint in one embodiment. The aperture area as a percentage of the grid is preferably between 40% and 60%.

In step 505, the physical layout for a deep n-well grid structure is performed. The grid layout is typically done using the smallest feature size attainable in order to maximize the probability of connection with the n-wells.

In step 510, the allowable site area for body biased n-wells is determined. The substrate surface is essentially divided into regions that are classified as connected or isolated, and the connected and isolated regions are separated by a buffer region that n-wells are not permitted to infringe. The buffer region ensures the connection or isolation of the surface n-wells. This method is predicated on a single mask for implanting the n-wells In step 515, the PFETs in the CMOS circuit are prioritized for placement in the connected region and the isolated region. Therefore, not all transistors may be body biased by the grid, in accordance with the prioritization. The factors that may be used to assign priority may include participation in a critical path in the circuit, voltage scalability, and power dissipation. Prioritization may also be done on the basis of the effects of leakage current anticipated by modeling of the transistors in the circuit.

In general, the priority for body biasing is related to the performance required of the transistor and the relationship of the performance level to the threshold voltage of the transistor. For example, with all other factors being equal, a transistor located in a critical path in a circuit block would be given priority over another transistor in the block that was not in the critical path. The priority level would in turn translate into a higher likelihood of the transistor being connected to the body bias grid.

In step 520, the circuit layout is performed, with the highest priority PFETs being placed in the available n-wells in the connected region. For example, the placement of the PFETs may be done by performing the initial layout without regard to priority, and then swapping the highest priority PFETs that are not in the connected region with their nearest neighbors with lower priority that are in the connected region. In some cases, the lowest priority transistors may not be coupled to the body bias grid.

Figure 6:
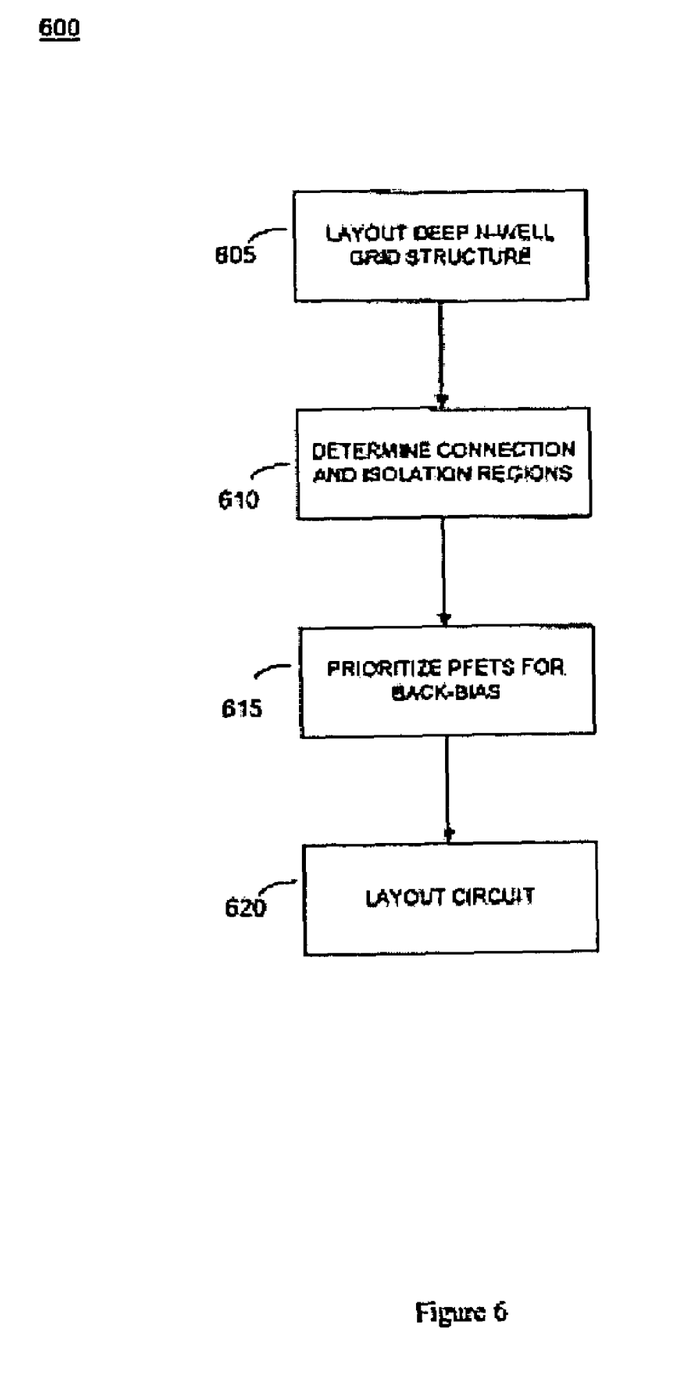
FIG. 6 shows a process flow diagram for optimizing body bias connections for a two-depth well implant process in accordance with an embodiment of the present claimed invention.

FIG. 6 shows a process flow diagram 600 for an alternative method embodiment that does not require a layout buffer region, but relies on two implant masks for the surface n-wells. In this process, a higher device density is obtained at the expense of a second well implant step.

In step 605, the layout for a deep n-well grid structure is performed. The grid layout is typically done using the smallest feature size attainable in order to maximize the probability of connection with the n-wells.

In step 610, the allowable site area for body biased n-wells is determined. The substrate surface is essentially divided into regions that are classified as connected or isolated. The n-wells that are ultimately placed in the connected region are designated for a deep implant, and the n-wells that are placed in the isolated region are designated for a shallow implant, with two masks being used for the overall well implant.

In step 615, the PFETs in the CMOS circuit are prioritized for placement in the connected region and the isolated region. The factors that may be used to assign priority may include participation in a critical path in the circuit, voltage scalability, and power dissipation. Prioritization may also be done on the basis of the effects of leakage current anticipated by modeling of the transistors in the circuit.

In step 620, the circuit layout is performed, with the highest priority PFETs being placed in the available n-wells in the connected region. For example, the placement of the PFETs may be done by performing the initial layout without regard to priority, and then swapping the highest priority PFETs that are not in the connected region with their nearest neighbors with lower priority that are in the connected region. In some cases, the lowest priority transistors may not be coupled to the body bias grid.

Figure 7:
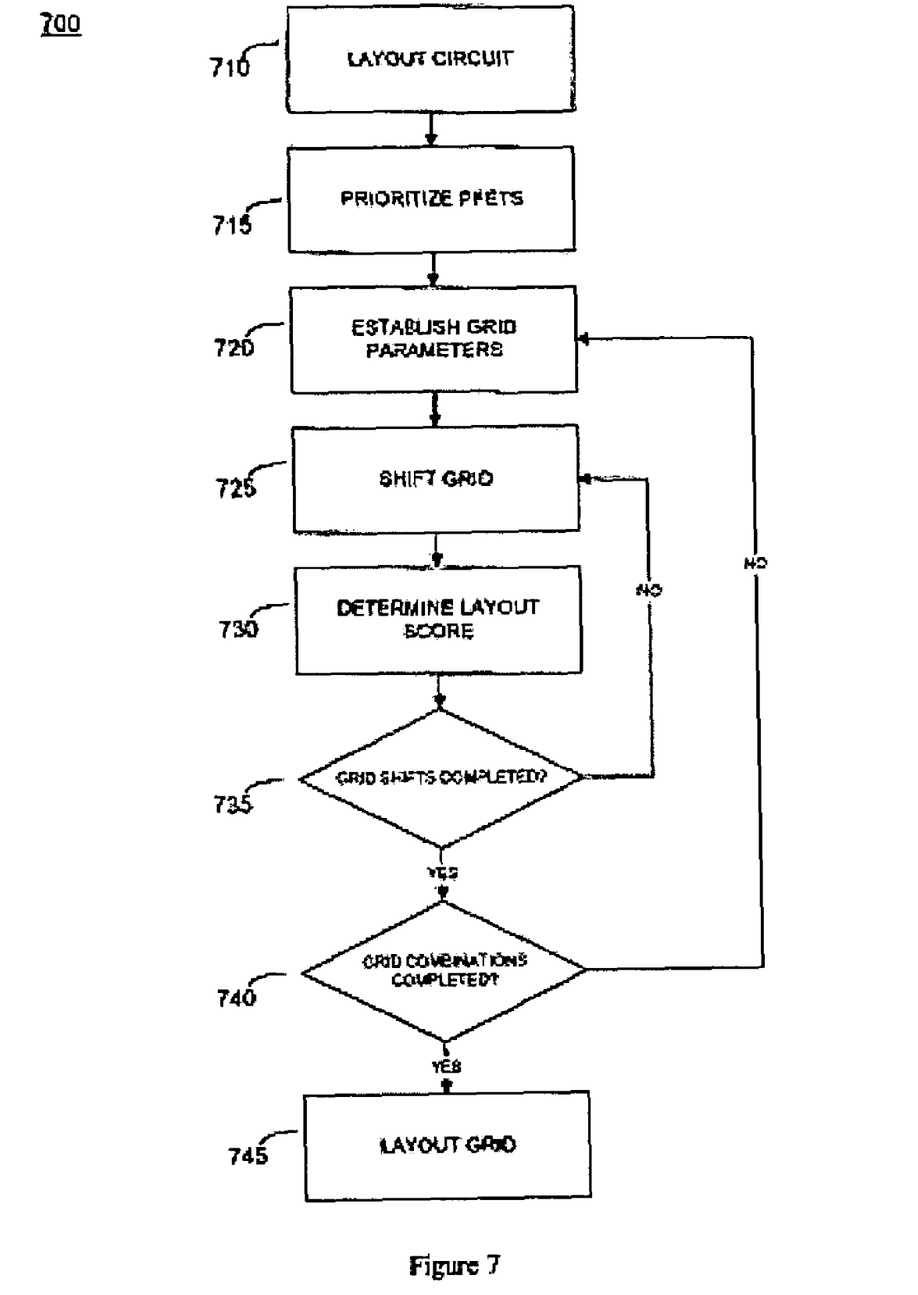
FIG. 7 shows a process flow diagram for optimizing body bias connections in a CMOS circuit using an adaptive deep n-well grid structure in accordance with an embodiment of the present claimed invention.

FIG. 7 shows a process flow diagram 700 for optimizing body bias connections in a CMOS circuit using an adaptive deep n-well grid structure. In the embodiments shown in FIG. 5 and FIG. 6, the location of the transistors in the layout may be modified in order to provide optimum body biasing. In the method shown in FIG. 7, the circuit layout is fixed, and the grid layout is adjusted to provide the optimum body biasing.

In step 710, the circuit layout is performed, with the n-well locations being determined. In step 715, the PFETs in the CMOS circuit are prioritized with respect their requirement for body biasing. The factors that may be used to assign priority may include participation in a critical path in the circuit, voltage scalability, and power dissipation. Prioritization may also be done on the basis of the effects of leakage current anticipated by modeling of the transistors in the circuit. Depending upon the circuit, one or more factors may be used. Each PFET in the layout may be assigned a score or ranking that is a weighted sum of the factors being considered. A factor may be excluded by giving it a weight of zero.

In step 720, grid parameters are selected from a set of parameters that are bounded by the minimum web dimension T, the minimum aperture dimension W and the aperture area percentage range of 40% to 60%.

In step 725, the grid is aligned with respect to the circuit layout at a position selected from a set of positions within a fixed area. The fixed area is typically a rectangular area that is sufficiently large to encompass all possible unique positions for the grid with respect to the circuit layout. Due to the periodic structure of the grid, the fixed area is typically less than 3 times the aperture area.

In step 730, the circuit layout/grid alignment is inspected to determine how many of the PFETs are in wells that are positioned so as to permit body biasing by the grid. The scores of the PFETs that are so positioned are summed to provide a grid layout score for the combination of grid parameters and position.

In step 735, a check is made to see if the set of possible grid positions has been exhausted. If the set has not been exhausted, then step 725 is repeated. If the set of possible grid positions has been exhausted, then step 740 is executed.

In step 740, a check is made to see if all combinations of grid parameters in the set have been exhausted. If all combinations have not been exhausted, then step 720 is repeated. If all combinations in the set have been exhausted, then step 745 is executed.

In step 745, the grid layout is performed using the grid dimensional parameters and alignment position that totaled the best score, e.g., above a predetermined threshold or otherwise selected range.

Figure 8:
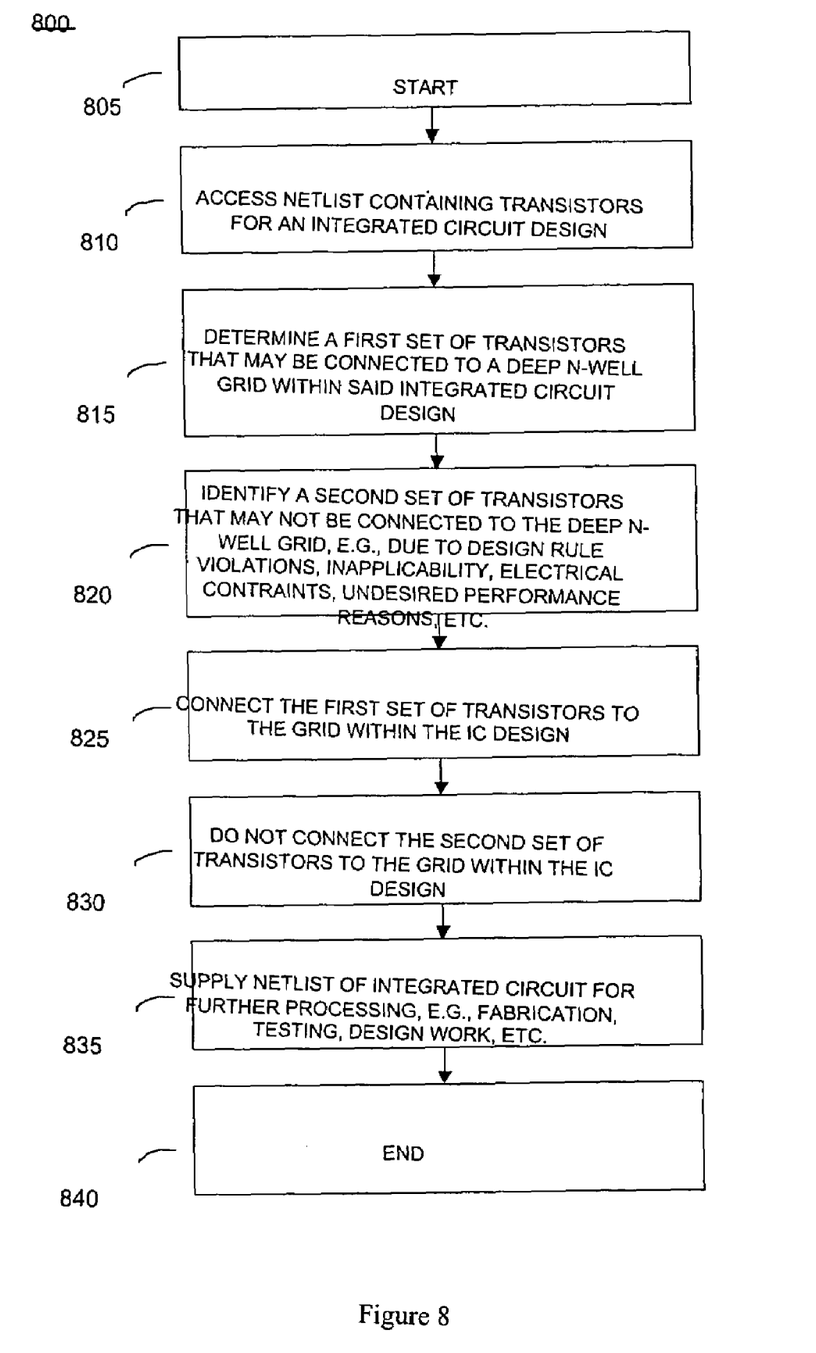
FIG. 8 shows a process flow diagram for implementing a partial deep n-well grid in a circuit design in accordance with an embodiment of the present claimed invention.

FIG. 8 shows a process flow diagram 800 for implementing a partial deep n-well grid in a circuit design in accordance with an embodiment of the present invention. At step 805 the process is started.

At step 810, a netlist for an integrated circuit design including transistors is accessed. An example of an integrated circuit design is a logic circuit using CMOS transistors.

At step 815, a first set of transistors belonging to the circuit design is determined. The first set of transistors is a set of transistors that may be connected to a deep n-well grid.

At step 820, a second set of transistors is identified. The second set of transistors is a set of transistors that may not be connected to the deep n-well grid. Different criteria may be used to determine which transistors are to be included in the second set. Examples of criteria are design rule violations, inapplicability, electrical constraints, undesired performance reasons, etc.

The layout of surface n-wells and deep n-wells may preclude a connection between an particular surface n-well and a particular deep n-well. An n-well containing a transistor may be too close to a deep n-well at another potential. A surface n-well surrounded by other surface n-wells at different potentials may be isolated from the deep n-well grid, or the connection path available may have an unacceptably high resistance.

At step 825, the first set of transistors in the design is connected to the deep n-well grid. At step 830, the second set of transistors is not connected to the grid. At step 835, the netlist for the integrated circuit design including connections between the first set of transistors and the grid is supplied for further processing, e.g., circuit fabrication, testing, design work, etc. At step 840 the process is done.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, there are many combinations of the parameters for the implant and anneal process steps, and their sequencing, that may be used to produce the structures described herein. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

The invention claimed is:

1. A method for optimizing body bias connections in a CMOS circuit substrate using a deep n-well grid structure, said method comprising:

performing a layout for said deep n-well grid structure which routes body bias voltage and which is buried at least a first depth below a surface of said CMOS circuit substrate;

determining an isolation region, and a connection region for placing body biased n-wells;

prioritizing a plurality of PFETs for placement in said body biased n-wells; and performing a circuit layout wherein the plurality of PFETs are placed in the CMOS circuit wherein a subset of said plurality of PFETs are placed in the body biased n-wells in accordance with said prioritizing.

2. The method of claim 1, wherein said deep n-well grid structure comprises an aperture that is approximately square with a dimension of substantially 7 microns.

3. The method of claim 1, wherein the layout of the deep n-well grid structure is performed independently from the circuit layout.

4. The method of claim 1, wherein the prioritizing is performed on the basis of inclusion on a critical path.

5. The method of claim 1, wherein the prioritizing is performed on the basis of power dissipation.

6. The method of claim 1, wherein the prioritizing is performed on the basis of the effects of leakage current anticipated by modeling of the plurality of PFETs.

7. The method of claim 1, further comprising determining a buffer region for separating said connection region and said isolation region.

8. A method for optimizing body bias connections in a CMOS circuit substrate using a deep n-well grid structure, said method comprising:

performing a layout for said deep n-well grid structure which routes body bias voltage and which is buried at least a first depth below a surface of said CMOS circuit substrate;

determining an isolation region, and a connection region for placing body biased n-wells;

prioritizing a plurality of PFETs for placement in said body biased n-wells; and performing a circuit layout wherein the plurality of PFETs are placed in one of said isolation region and said body-biased n-wells of said connection region in accordance with said prioritizing of the PFETs.

9. The method of claim 8, wherein said deep n-well grid structure comprises an aperture that is approximately square with a dimension of substantially 7 microns.

10. The method of claim 8, wherein the grid layout is performed independently from the circuit layout.

11. The method of claim 8, wherein the prioritizing is performed on the basis of inclusion on a critical path.

12. The method of claim 8, wherein the prioritizing is performed on the basis of power dissipation.

13. The method of claim 8, wherein the prioritizing is performed on the basis of the effects of leakage current anticipated by modeling of the PFETs.

* * * * *